United States Patent [19]

Nguyen-Kim et al.

[11] Patent Number: 5,035,979

[45] Date of Patent: * Jul. 30, 1991

[54] RADIATION-SENSITIVE MIXTURE

[75] Inventors: Son Nguyen-Kim, Hemsbach; Gerhard Hoffmann, Otterstadt; Reinhold Schwalm, Wachenheim, all of Fed. Rep. of Germany

[73] Assignee: BASF Aktiengesellschaft, Ludwigshafen, Fed. Rep. of Germany

[*] Notice: The portion of the term of this patent subsequent to Jul. 23, 2008 has been disclaimed.

[21] Appl. No.: 422,456

[22] Filed: Oct. 17, 1989

[30] Foreign Application Priority Data

Nov. 4, 1988 [DE] Fed. Rep. of Germany ....... 3837438

[51] Int. Cl.$^5$ .................. G03C 1/73; G03C 1/76
[52] U.S. Cl. .................. 430/270; 430/272; 430/326; 430/330
[58] Field of Search ........... 430/270, 326, 330, 272

[56] References Cited

U.S. PATENT DOCUMENTS

| | | | |
|---|---|---|---|
| 3,915,706 | 10/1975 | Limburg et al. | |
| 4,284,706 | 8/1981 | Clecak et al. | 430/326 |
| 4,311,782 | 1/1982 | Buhr et al. | 430/270 |
| 4,491,628 | 1/1985 | Ito et al. | |
| 4,624,908 | 11/1986 | Schwartzkopf | 430/326 |
| 4,678,737 | 7/1987 | Schneller | 406/927 |
| 4,689,288 | 8/1987 | Buiguez et al. | 570/844 |
| 4,737,426 | 4/1988 | Roth | 430/326 |
| 4,770,977 | 9/1988 | Buiguez et al. | 570/844 |
| 4,808,512 | 2/1989 | Schwartzkopf | 430/326 |
| 4,877,719 | 10/1989 | Higashi et al. | 430/326 |

FOREIGN PATENT DOCUMENTS 291994 11/1988 European Pat. Off. ............ 430/270

OTHER PUBLICATIONS

Crivello, Org. Coatings and Appl. Polym. Sci., 48, pp. 65–69.
Solid–State Thermolysis of Poly(p-t-Butoxycarbonyloxystyrene) . . . Journal of Polymer Science: part A., Polymer Chemistry Edit., vol. 24; 297–2980 (1986).
U.S. Patent Application Ser. No. 07/219,689=DE 37 21 741.

*Primary Examiner*—Marion E. McCamish
*Assistant Examiner*—Christopher D. Rodee
*Attorney, Agent, or Firm*—Keil & Weinkauf

[57] ABSTRACT

The invention relates to a radiation-sensitive mixture essentially consisting of
(a) a water-insoluble binder or binder mixture which is soluble in aqueous alkaline solutions,
(b) a compound which upon irradiation forms a strong acid and
(c) one or more organic compounds which inhibit the solubility of (a) in aqueous alkaline solutions, where the organic compound (c) is a malonic acid ester.

This radiation-sensitive mixture may be used to prepare photoresists.

10 Claims, No Drawings

RADIATION-SENSITIVE MIXTURE

The present invention relates to positively-working radiation-sensitive mixtures which contain a water-insoluble binder which is soluble in aqueous alkaline solutions, a compound which forms an acid under the influence of radiation and an organic compound which under acid catalysis is hydrolyzed and decarboxylated, thereby increasing the alkali solubility of the mixture. These mixtures are sensitive to UV radiation, electron beams and X-rays and are particularly suitable for use as a resist material.

Positively working radiation-sensitive mixtures are known and in particular positively working resist materials which contain o-quinonediazides in binders soluble in aqueous alkali, eg. novolacs or poly-p-vinylphenols are employed commercially. However, the sensitivity of these systems to radiation, especially short-wave radiation, is in part unsatisfactory.

Increases of sensitivity in radiation-sensitive systems which in the primary photoreaction produce a species which then, independently of the radiation, triggers a catalytic secondary reaction have been disclosed. For example, U.S. Pat. No. 3,915,706 describes photoinitiators which produce a strong acid which then, in a secondary reaction, cleaves acid-labile groups, such as polyaldehyde groups.

Further, radiation-sensitive mixtures based on acid-cleavable compounds are known which contain a polymer soluble in aqueous alkali as the binder, together with a compound which photochemically forms a strong acid and a further compound having acid-cleavable bonds, which as a result of the action of the acid increase in solubility in an alkaline developer (cf. DE-A 3,406,927). Compounds mentioned as photochemically forming a strong acid are diazonium, phosphonium, sulfonium and iodonium compounds as well as halogen compounds. The use of such onium salts as photochemical acid donors in resist materials is also disclosed, for example, in U.S. Pat. No. 4,491,628. A survey of the use of onium salts and resist materials is given by Crivello in Org. Coatings and Appl. Polym. Sci., 48 (1985), 65–69.

Radiation-sensitive mixtures of polymers having acid-labile side groups and photochemical acid donors are disclosed, for example, in U.S. Pat. No. 4,491,628 and FR-A 2,570,844. However, these polymeric binders are hydrophobic and only become alkali-soluble after exposure.

Copolymers with phenolic and acid-labile groups, for example poly-(p-hydroxystyrene-co-t-butoxycarbonyloxystyrene) are known from J. Polym. Sci., Part A, Polym. Chem. Ed., (1986), 2971–2980. However, if those copolymers of the said group which are still alkali-soluble are used in conjunction with commercial sulfonium salts such as triphenylphosphonium hexafluoroarsenate, as also described in U.S. Pat. No. 4,491,628, the mixtures have the disadvantage that very extensive removal of the unexposed areas takes place, since the said sulfonium salts do not adequately contribute to solubility inhibition.

DE-A 3,721,741 describes radiation-sensitive mixtures which contain a polymeric binder soluble in aqueous alkaline solutions together with an organic compound of which the solubility in an aqueous alkaline developer is increased by the action of acid and which contains at least one acid-cleavable group, this organic compound forming a strong acid under the influence of radiation.

It is an object of the present invention to provide novel positively working highly active radiation-sensitive systems for the production of relief structures, which systems can be developed with aqueous alkaline solutions and which permit the preparation of coatings which are sensitive to short-wave ultraviolet.

To use such materials, a radiation-sensitive mixture which contains a water-insoluble binder soluble in aqueous alkaline solution, an acid-labile organic compound which under the influence of acid is hydrolyzed and decarboxylated, and a compound which upon irradiation forms a strong acid, is to be irradiated imagewise and heated, and the imagewise-irradiated areas of the layer are to be washed out with developer solution.

We have found, surprisingly, that these objects are achieved and that highly active radiation-sensitive systems for the production of relief structures, the systems being responsive to short-wave ultraviolet and being distinguished particularly by very good reproducibility and high resolution, are obtained by the use of malonic acid esters as compounds which inhibit the solubility of binders in aqueous alkaline solutions.

Accordingly, the present invention relates to a radiation-sensitive mixture essentially consisting of (a) a water-insoluble binder or binder mixture which is soluble in aqueous alkaline solutions, (b) a compound which upon irradiation forms a strong acid and (c) one or more organic compounds which inhibit the solubility of (a) in aqueous alkaline solutions, wherein the organic compound (c) is a malonic acid ester of the general formula (I)

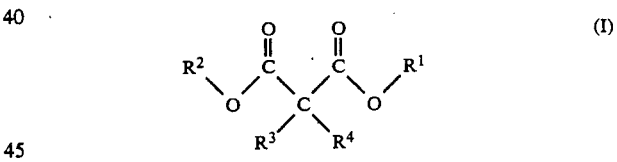

where

R$^1$ and R$^2$ may be identical or different and each is alkyl, cycloalkyl, aralkyl, trialkylsilyl or a heterocyclic radical, or R$^1$ and R$^2$ together form an oxygen-containing six-membered heterocyclic ring, and R$^3$ and R$^4$ are identical or different and each is hydrogen, halogen, alkyl, cycloalkyl, alkoxy, aralkyl, aryl, aralkyl which is halogen-substituted in the aryl moiety or halogen-substituted aryl.

The radiation-sensitive mixture may contain, as binder (a), a phenolic resin, for example a novolac with a mean molecular weight $M_n$ of from 200 to 20,000, a copolymer of p-hydroxystyrene and p-tert.-butoxycarbonyloxystyrene, a copolymer of p-hydroxystyrene and an alkoxystyrene or a copolymer of p-hydroxystyrene and 2-tetrahydropyranyloxystyrene, or a mixture of these.

The preferred compounds (b) which on irradiation form a strong acid are sulfonium salts of the general formula (II)

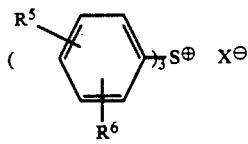

and iodonium of the general formula (III)

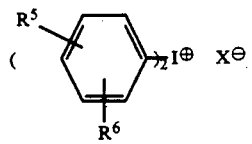

where $R^5$ and $R^6$ may be identical or different and each is H, OH or one of the radicals

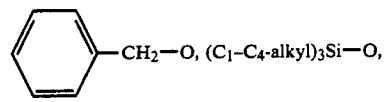

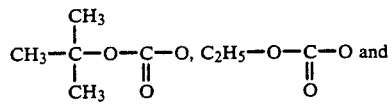

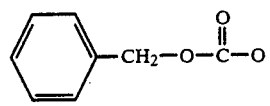

and $X^\ominus = Cl^\ominus$, $Br^\ominus$, $ClO_4^\ominus$, hexafluoroarsenate, hexafluoroantimonate, hexafluorophosphate and/or tetrafluoroborate.

Preferred malonic acid esters are dialkyl bromomalonates or chloromalonates, where alkyl is of 1 to 4 carbon atoms, dialkyl benzylmalonates and 4-bromobenzylmalonates, where alkyl is of 1 to 4 carbon atoms, dibenzyl malonate, di(trimethylsilyl) malonate, di(tetrahydropyranyl) malonate and the cycloisopropylidene esters of bromomethylmalonic, bromoethylmalonic, methylphenylmalonic or bromobenzylmalonic acid.

The present invention further relates to a process for the preparation of relief structures or for the structuring of wafers by applying a photoresist solution in a thickness of from 0.1 to 5 μm onto a conventionally treated substrate, drying the coating, exposing it imagewise, with or without subsequent heating at up to 150° C., and developing with an aqueous alkaline solution, where the photoresist solution employed contains a radiation-sensitive mixture according to the invention.

The process according to the invention is particularly advantageous since it ensures very good reproducibility. The relief structures obtained by the process exhibit high resolution.

The following detailed comments relate to the components of the radiation-sensitive mixture according to the invention.

a) Because of plasma etching resistance which is in most cases required, the water-insoluble binders or binder mixtures which are soluble in aqueous alkaline solutions are in general phenolic resins, eg. novolacs having molecular weights $M_n$ from 200 to 20,000, preferably from 300 to 2,000 g/mole and, for exposures to short-wave ultraviolet ($\leq 300$ nm) especially novolacs based on p-cresol/formaldehyde, poly(p-hydroxystryenes) and poly(p-hydroxy-α-methylstyrenes), these poly(p-hydroxystyrenes) in general having molecular weights $M_n$ of from 200 to 100,000, preferably from 1,000 to 40,000, g/mole; they can furthermore also be modified in a conventional manner by a polymer-analogous reaction of their hydroxyl groups with, for example, chloroacetic acid, chloroacetic acid esters, alkyl halides, benzyl halides, 3,4-dihydropyran, dihydrofuran, chlorocarbonic acid esters and/or pyrocarbonic acid esters. The polymeric binders (a) thus obtainable, which for the purposes of this application are also to be understood as copolymers, are, for example, based on p-hydroxystyrene and p-tert.-butoxycarbonyloxystyrene, p-hydroxystyrene and an alkoxystyrene or p-hydroxystyrene and 2-tetrahydropyranyloxystyrene. Preferred copolymers of p-hydroxystyrene, which bear lateral protective groups, essentially contain groups of the formula

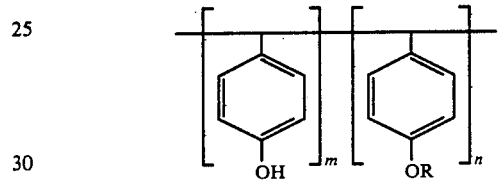

where
n is less than or equal to m and

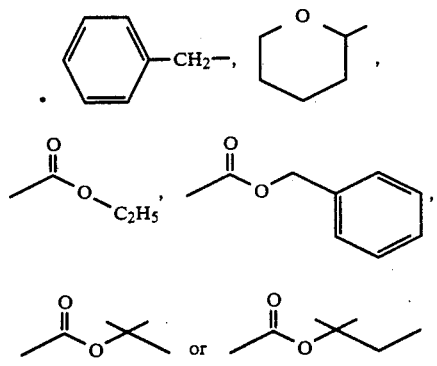

ie. copolymers which contain p-benzyloxystyrene, p-(2-tetrahydropyranyl)-oxystyrene, p-(iso-propyloxycarbonyl)oxystyrene, p-(cyclohexyloxycarbonyl)-oxystyrene, p-(benzyloxycarbonyl)-oxystyrene, p-(t.butyloxycarbonyl)oxystyrene and/or p-(t-pentyloxycarbonyl)-oxystyrene units. Mixtures of the above binders (a) may also be used. The binder (a) is in general present in the mixture according to the invention in an amount of from 45 to 95, preferably from 80 to 90, % by weight, based on the total amount of the radiation-sensitive mixture (a)+(b)+(c). b) Suitable compounds (b) which on irradiation form a strong acid are in principle all compounds which possess this property and accordingly act as acid donors. However, iodonium salts especially sulfonium salts are preferred for irradiation with short-wave ultraviolet. These salts correspond to the general formula (II) or (III)

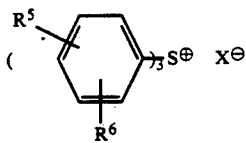
(II)

or

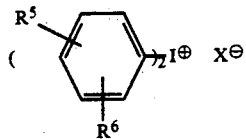
(III)

where
$R^5$ and $R^6$ are identical or different and each is H, (triphenylsulfonium salt or diphenyliodonium salt), OH

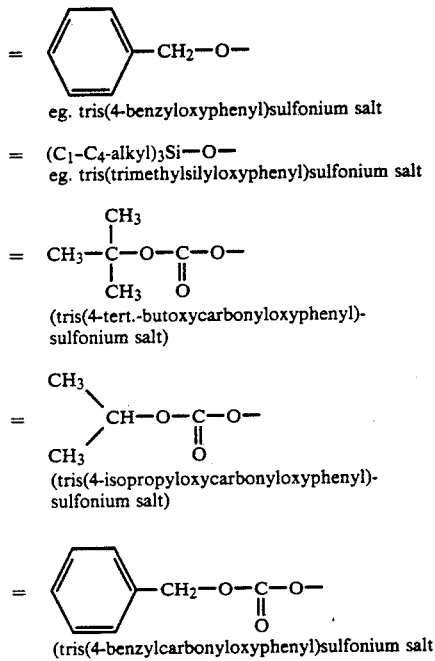

eg. tris(4-benzyloxyphenyl)sulfonium salt

= $(C_1$-$C_4$-alkyl$)_3$Si—O—
eg. tris(trimethylsilyloxyphenyl)sulfonium salt (tris(4-tert.-butoxycarbonyloxyphenyl)-sulfonium salt)

(tris(4-isopropyloxycarbonyloxyphenyl)-sulfonium salt)

(tris(4-benzylcarbonyloxyphenyl)sulfonium salt)

$X^\ominus = Cl^\ominus$, $Br^\ominus$, $ClO_4^\ominus$, $AsF_6^\ominus$, $PF_6^\ominus$, $SbF_6^\ominus$ and/or $BF_4^\ominus$.

Mixtures of the compounds mentioned under (b) may also be employed. In general, the amount of component (b) in the radiation-sensitive mixture according to the invention is from 0.1 to 20, preferably from 2 to 10, % by weight, based on the total amount of the radiation-sensitive mixture (a)+(b)+(c).

c) According to the invention, the organic compound (c) employed to inhibit the dissolution of the binder (a) is a malonic acid ester of the general formula (I)

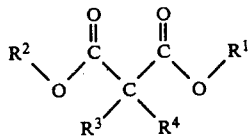
(I)

where
$R^1$ and $R^2$ are identical or different and each is alkyl, such as n-alkyl of 1 to 8 carbon atoms, eg. methyl, ethyl, n-propyl or n-butyl, sec. alkyl of 3 to 7 carbon atoms, eg. isopropyl or sec. butyl, tert.-alkyl of 4 or 5 carbon atoms, eg. tert.-butyl and tert.-amyl, cycloalkyl of 5 to 7 carbon atoms, eg. cyclohexyl, aralkyl, where alkyl is of 1 or 2 carbon atoms, eg. benzyl, trialkylsilyl, such as where alkyl is of 1 to 4 carbon atoms, eg. trimethylsilyl and triethylsilyl, or a heterocyclic radical, eg.

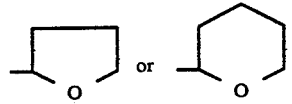

$R^1$ and $R^2$ together form an oxygen-containing six-membered cyclic ring, eg.

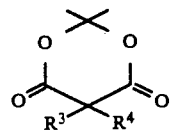

and
$R^3$ and $R^4$ are identical or different and each is hydrogen, halogen, eg. Cl, Br or I, Cl and Br being preferred, alkyl, such as n-alkyl of 1 to 4 carbon atoms, eg. methyl, ethyl, n-propyl or n-butyl, or alkoxy, eg. methoxy, ethoxy, propoxy or butoxy, with the proviso that only one of the radicals $R^3$ and $R^4$ may be alkoxy, aryl, such as phenyl, especially halogen-substituted aryl, eg. chlorophenyl or bromophenyl, aralkyl, where alkyl is of 1 or 2 carbon atoms, eg. benzyl, and halogen-substituted aralkyl, especially Br-substituted or Cl-substituted aralkyl, eg. 4-bromobenzyl.

Examples of such malonic acid esters are diethyl bromomalonate, di-isobutyl chloromalonate, di-tert.-butyl bromomalonate, di-trimethylsilyl malonate, dibenzyl malonate, ditetrahydropyranyl malonate, diethyl benzylmalonate, di-tert.-butyl benzylmalonate, diethyl 4-bromobenzylmalonate, diethyl methylmalonate, diethyl ethylmalonate, diethyl propylmalonate, diisobutyl methylmalonate, diisobutyl ethylmalonate, diisobutyl propylmalonate, di-tert.-butyl methylmalonate, di-tert.-butyl ethylmalonate, di-tert.-butyl propylmalonate, di(trimethylsilyl) methylmalonate, di(trimethylsilyl) ethylmalonate, di(trimethylsilyl) propylmalonate, cycloisopropylidene bromomethylmalonate, cyclo-isopropylidene bromoethylmalonate, cyclo-isopropylidene methylphenylmalonate and cycloisopropylidene benzylbromomalonate.

Mixtures of the above malonic acid esters may also be employed. The radiation-sensitive mixture according to the invention in general contains the malonic acid esters (c) in amounts of from 3 to 35, preferably from 10 to 25, % by weight, based on the total amount of the mixture of (a), (b) and (c).

The radiation-sensitive mixture according to the invention may furthermore contain additional conventional assistants and adjuvants.

The mixtures according to the invention are preferably dissolved in an organic solvent, the solids content in general being from 5 to 40% by weight. Preferred solvents are aliphatic ketones, ethers and esters, as well as mixtures of these. Particularly preferred solvents are alkylene glycol monoalkyl ethers, for example ethyl cellosolve, butylglycol, methyl cellosolve and 1- methoxy-2-propanol, alkylene glycol alkyl ether esters, for example methyl cellosolve acetate, ethyl cellosolve acetate, methyl propylene glycol acetate and ethyl propylene glycol acetate, ketones, for example cyclohexanone, cyclopentanone and methyl ethyl ketone, as well as acetates, such as butyl acetate, and aromatics, such as toluene and xylene. The choice of the appropriate solvent or solvent mixture depends on the choice of the particular phenolic polymer, novolac and photosensitive component.

Adjuvants such as adhesion promoters, wetting agents, dyes and plasticizers may also be added.

Where appropriate, small amounts of sensitizers may also be added, in order to sensitize the compounds in the range from longer-wave ultraviolet to the visible. Polycyclic aromatics, such as pyrene and perylene, are preferred for this purpose, but other dyes which act as sensitizers may also be used.

In the process according to the invention for the preparation of reliefs, a radiation-sensitive recording layer which essentially consists of the radiation-sensitive mixture according to the invention is exposed imagewise with a dose such that the solubility of the exposed areas in aqueous alkaline solvents increases and these exposed areas may then be selectively removed with the alkaline developer.

The radiation-sensitive mixture according to the invention may be used as a photoresist for the preparation of relief structures for semiconductor components.

The photoresist solution containing the radiation-sensitive mixture according to the invention is in general applied in a thickness of from 0.1 to 5 μm, preferably from -b 0.5 to -b 1.5 μm, onto a suitable substrate, for example a surface-oxidized silicon wafer, by spin coating, and is then dried (eg. at from 70° to 130° C.) and exposed imagewise, under a photomask, to a suitable light source. The latter is in particular a source of short-wave ultraviolet, with wavelengths of from 200 to 300 nm. A KrF Excimer laser (248 nm) is particularly suitable. After imagewise exposure, with or without brief postbake at up to 150° C., development is carried out with conventional aqueous alkaline developer solution, in general at a pH of from 12 to 14, in the course of which the exposed areas are washed out. The resolution is within the submicron range. The exposure energy required for the radiation-sensitive mixtures according to the invention is in general from 30 to 200 mJ/cm² for coatings 1 μm thick.

In the Examples which follow, parts and percentages are by weight, unless stated otherwise.

EXAMPLE 1

A photoresist solution is prepared from 70 parts of poly-(p-hydroxystyrene) (a commercial product from Polysciences Inc., molecular weight 1,500–7,000), 4 parts by weight of triphenylsulfonium hexafluoroarsenate (a commercial product from ALFA), 16 parts of diethyl bromomalonate and 270 parts of ethylene glycol monomethyl ether acetate.

The solution is subsequently passed through a filter of pore diameter 0.2 μm.

The resist solution is then spun-coated at 4,000 rpm for 30 seconds onto a silicon wafer having an SiO₂ surface which itself has been coated with hexamethyldisilazane as an adhesion promoter, the dry layer thickness of resist obtained being about 1 μm. The wafer is dried for 3 minutes on a hot plate at 80° C., then brought into contact with a test mask having an image structure and exposed for 2.5 seconds to an Excimer laser (λ=248 nm, E=35 mW/cm²). The wafer is then heated for 1 minute at 80° C. and developed using a developer of pH 12.1–13.4.

EXAMPLE 2

A photoresist solution is prepared from 80 parts of poly-(p-hydroxystyrene), 6 parts of triphenylsulfonium hexafluoroarsenate, 14 parts of diethyl benzylmalonate and 270 parts of ethylene glycol monomethyl ether acetate. The procedure followed is as in Example 1. The sensitivity is 110 mJ /cm².

EXAMPLE 3

A photoresist solution is prepared from 80 parts of poly-(p-hydroxystyrene), 6 parts of triphenylsulfonium hexafluoroarsenate, 14 parts of dibenzyl malonate and 270 parts of ethylene glycol monomethyl ether acetate. The procedure followed is as in Example 1. The sensitivity is 130 mJ /cm².

EXAMPLE 4

A photoresist solution is prepared from 80 parts of poly-(p-hydroxystyrene), 6 parts of diphenyliodonium hexafluorophosphate (a commercial product from ALFA), 14 parts of methylmeldrum acid

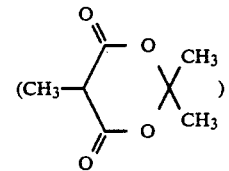

and 250 parts of ethylene glycol monomethyl ether acetate. The procedure followed is as in Example 1, but without the postbake step (80° C./1 min after exposure). The sensitivity is 40 mJ /cm².

We claim:

1. A radiation-sensitive mixture essentially consisting of
    (a) a water-insoluble binder or binder mixture which is soluble in aqueous alkaline solutions,
    (b) a compound which upon irradiation forms a strong acid and
    (c) one or more organic compounds which inhibit the solubility of (a) in aqueous alkaline solutions,
wherein the organic compound (c) is a malonic acid ester of the general formula (I)

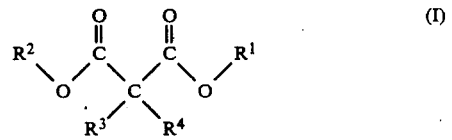

where
   $R^1$ and $R^2$ may be identical or different and each is alkyl, cycloalkyl, aralkyl, trialkylsilyl or a heterocyclic radical, or $R^1$ and $R^2$ together form an oxygen-containing six-membered heterocyclic ring, and
   $R^3$ and $R^4$ are identical or different and each is hydrogen, halogen, alkyl, cycloalkyl, alkoxy, aralkyl, aryl, aralkyl which is halogen-substituted in the aryl moiety or halogen-substituted aryl.

2. A radiation-sensitive mixture as claimed in claim 1, wherein the binder (a) is a phenolic resin.

3. A radiation-sensitive mixture as claimed in claim 2, wherein the phenolic resin is a novolac having a mean molecular weight $M_n$ of from 200 to 20,000.

4. A radiation-sensitive mixture as claimed in claim 1, wherein the binder (a) is poly(p-hydroxystyrene), poly(p-hydroxy-α-methylstyrene) or a copolymer of p-hydroxystyrene and p-tert.-butoxycarbonyloxystyrene, p-hydroxystyrene and an alkoxystyrene or p-hydroxystyrene and 2-tetrahydropyranyloxystyrene.

5. A radiation-sensitive mixture as claimed in claim 1, wherein the compound (b), which on irradiation forms a strong acid, is a sulfonium salt of the general formula (II)

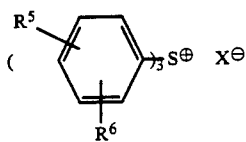

or the compound (b) which on irradiation forms a strong acid is an iodonium salt of the general formula (III)

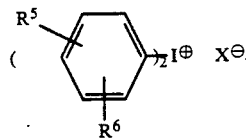

where $R^5$ and $R^6$ are identical or different and each is H, OH or one of the radicals

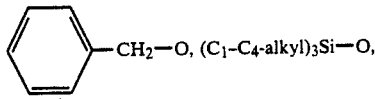

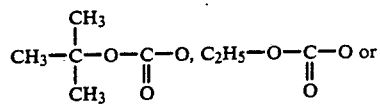

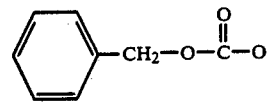

and $X^\ominus = Cl^\ominus$, $Br^\ominus$, $ClO_4^\ominus$, hexafluoroarsenate, hexafluoroantimonate, hexafluorophosphate and/or tetrafluoroborate.

6. A radiation-sensitive mixture as claimed in claim 1, wherein the malonic acid ester of the general formula (I) is a dialkyl bromomalonate or chloromalonate, where alkyl is of 1 to 4 carbon atoms.

7. A radiation-sensitive mixture as claimed in claim 1, wherein the malonic acid ester of the general formula (I) is a dialkyl benzylmalonate or 4-bromobenzylmalonate, where alkyl is of 1 to 4 carbon atoms.

8. A radiation-sensitive mixture as claimed in claim 1, wherein the malonic acid ester of the general formula (I) is dialkyl malonate, di(trimethylsilyl) malonate or di(tetrahydropyranyl) malonate.

9. A radiation-sensitive mixture as claimed in claim 1, wherein the malonic acid ester of the general formula (I) is a cycloisopropylidene ester of bromomethylmalonic acid, bromoethylmalonic acid, methylphenylmalonic acid or bromobenzylmalonic acid.

10. A process for the preparation of relief structures or for the structuring of wafers by applying a photoresist solution in a thickness of from 0.1 to 5 μm onto a silicon wafer having an $SiO_2$ surface which itself may be coated with hexamethyldisilazine, drying the coating, exposing it imagewise with or without subsequent heating at up to 150° C., and developing with an aqueous alkaline solution, wherein the photoresist solution employed contains a radiation-sensitive mixture as claimed in claim 1.

* * * * *